United States Patent [19]
Hernandez

[11] Patent Number: 5,272,590

[45] Date of Patent: Dec. 21, 1993

[54] INTEGRATED CIRCUIT PACKAGE HAVING AN INTERNAL CAVITY FOR INCORPORATING DECOUPLING CAPACITOR

[76] Inventor: Jorge M. Hernandez, 1920 E. Jarvis, Mesa, Ariz. 85202

[21] Appl. No.: 479,074

[22] Filed: Feb. 12, 1990

[51] Int. Cl.$^5$ .................. H01G 1/14; H01G 4/10
[52] U.S. Cl. .................. 361/306.2; 361/321.1
[58] Field of Search ............ 361/306, 321, 386; 29/25.42; 357/74; 174/72, 52 FP

[56] References Cited

U.S. PATENT DOCUMENTS

| | | | |
|---|---|---|---|
| 2,972,570 | 2/1961 | Haas et al. | 361/321 X |
| 4,670,833 | 6/1987 | Sachs | 361/386 X |
| 4,853,826 | 8/1989 | Hernandez | 361/306 |
| 4,918,513 | 4/1990 | Kurose et al. | 357/74 |

OTHER PUBLICATIONS

Multilayer Ceramic Capacitors and IC's; E. Philofsky; Electronic Engineering Jun. 1982.
Functional Testing of Decoupling Capacitors For Dynamic Rams; A. G. Martin; AVX Ceramics & Ward Parkinson; Micron Technology 1982.

Primary Examiner—Donald A. Griffin

[57] ABSTRACT

A decoupling scheme is presented which is particularly well suited for use with integrated circuit packages having internal cavities for receiving an integrated circuit chip such as Pin Grid Array (PGA) packages, ceramic dual-in-line packages, ceramic flat packs and ceramic leadless chip carriers. In accordance with the present invention, a decoupling capacitor (which preferably comprises a very thin high capacitance layer made by a thick film or thin film process sandwiched between an inner and outer electrode layer) is positioned within the internal cavity of an integrated circuit package such as a PGA package and electrically connected to the IC chip within the cavity. In a particularly preferred embodiment, the decoupling capacitor has a novel configuration for improved heat transfer. This novel configuration includes a pair of parallel plate electrodes wherein the upper electrode has extended flaps which wrap around the top surface of the decoupling capacitor.

21 Claims, 7 Drawing Sheets

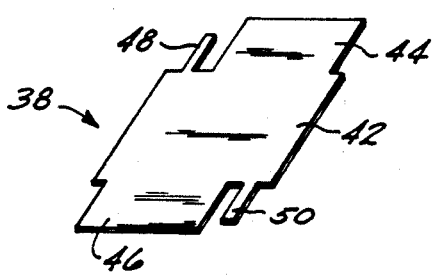
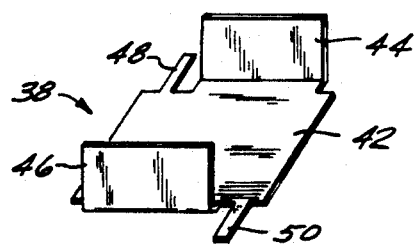
FIG. 5A    FIG. 5B
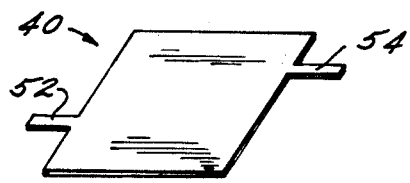
FIG. 6    FIG. 7
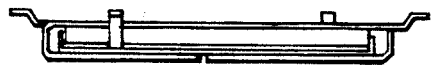
FIG. 8
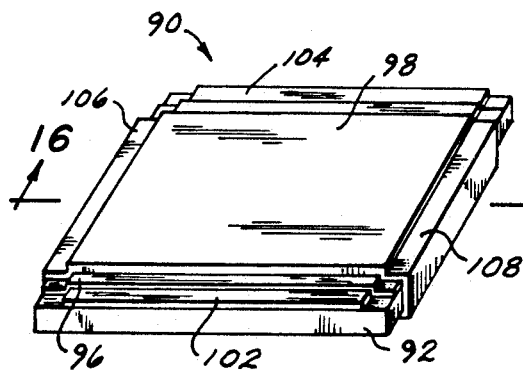
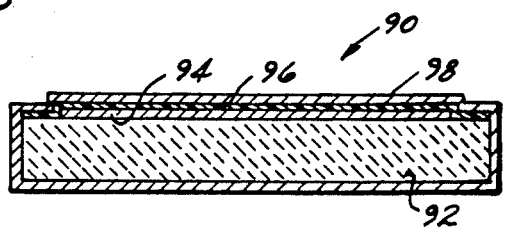
FIG. 15    FIG. 16
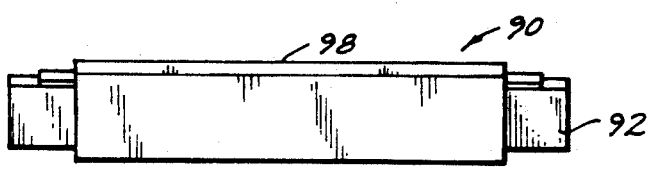
FIG. 17

INTEGRATED CIRCUIT PACKAGE HAVING AN INTERNAL CAVITY FOR INCORPORATING DECOUPLING CAPACITOR

BACKGROUND OF THE INVENTION

This invention relates to the field of integrated circuits packaged in a housing having an internal cavity. More particularly, this invention relates to a method of suppressing noise (e.g. decoupling) from the voltage to ground distribution circuit in integrated circuit packages of the type having internal cavities such as pin grid array (PGA), ceramic dual-in-line, ceramic quad flat packs, ceramic leadless chip carrier packages and the like.

This application is related to U.S. application Ser. No. 479,075 entitled MOLDED INTEGRATED CIRCUIT PACKAGE INCORPORATING DECOUPLING CAPACITOR invented by Jorge Hernandez and U.S. application Ser. No. 479,095 entitled THIN DECOUPLING CAPACITOR FOR MOUNTING UNDER INTEGRATED CIRCUIT PACKAGE invented by Jorge Hernandez and A. B. Feinberg, and U.S. application Ser. No. 479,071 entitled MOLDED INTEGRATED CIRCUIT PACKAGE INCORPORATING THIN DECOUPLING CAPACITOR invented by Jorge Hernandez, all of which have been filed contemporaneously with this application.

It is well known in the field of microelectronics that high frequency operation, particularly the switching of integrated circuits, can result in transient energy being coupled into the power supply circuit. It is also well known that integrated circuits are becoming more dense (more gates per unit area of silicon/or gallium arsenide), more powerful (more watts per unit area of IC chip), and faster with higher clock rate frequencies and with smaller rise times. All of these continuing developments make the problem of suppressing noise in the power bus (produced by a large amount of simultaneous gates switching) even more serious than in the past.

Generally, the prevention of the coupling of undesired high frequency noise or interference into the power supply for an integrated circuit is accomplished by connecting a decoupling capacitor between the power and the ground leads of the IC. Conventional methods of decoupling (noise suppression) include the use of decoupling capacitors external to the IC package, such as monolithic multilayer ceramic chip capacitors. One external connection scheme of this type which has been found to be quite successful is to mount a decoupling capacitor underneath an integrated circuit. Such decoupling capacitors are commercially available from Rogers Corporation (assignee of the present application) and are sold under the trademark MICRO Q. Examples of these decoupling capacitors are found in U.S. Pat. Nos. 4,475,143, 4,502,101 and 4,748,537, all of which are assigned to the assignee hereof. U.S. Pat. Nos. 4,626,958, 4,667,267, 4,658,327, 4,734,818, 4,734,819 and 4,853,826 are also assigned to the assignee hereof. These patents disclose decoupling capacitors which are particularly well suited for pin grid array and plastic leaded chip carrier packages.

Still other decoupling connection schemes are known. For example, multilayer capacitor (MLC) chips have been placed on top of PGA ceramic IC packages with interconnections built in from the surface of the PGA package down to the proper places in internal circuitry of the package. In still some other cases, schemes have been devised to incorporate a MLC chip into a specially configured IC lead frame, but due to production difficulties, this approach has not become widely accepted. Attempts have also been made to build a capacitive layer into a PGA ceramic package (and into a leadless ceramic chip carrier), by using thin layers of alumina or other adequate ceramic dielectric material. Again, this approach has not found wide acceptance.

For a number of years, the users of integrated circuits have been aware of the need to reduce the inductance of the decoupling loop, so that switching noise can be minimized. The best way to accomplish this is by placing the decoupling capacitor as close to the IC chip (silicon or gallium arsenide) as possible. Ideally, the decoupling capacitor should be built in with the IC itself. However, due to materials and processing incompatibilities, this is not possible at the present time.

Accordingly, there continues to be a need for improved connection schemes for decoupling undesired high frequency noise from integrated circuits wherein the inductance within the decoupling loop is reduced to as low a level as possible.

SUMMARY OF THE INVENTION

The above-discussed and other problems and deficiencies of the prior art are overcome or alleviated by the decoupling scheme of the present invention which is particularly well suited for use with integrated circuit packages having internal cavities for receiving an integrated circuit chip such as Pin Grid Array (PGA) packages, ceramic dual-in-line packages, ceramic flat packs and ceramic leadless chip carriers. In accordance with the present invention, a decoupling capacitor which preferably comprises a very thin high capacitance layer made by a thick film or thin film process sandwiched between an inner and outer electrode layer is positioned within the internal cavity of an integrated circuit package such as a PGA package and electrically connected to the IC chip within the cavity. In a particularly preferred embodiment, the decoupling capacitor has a novel configuration for improved heat transfer. This novel configuration includes a pair of parallel plate electrodes wherein the upper electrode has extended flaps which wrap around the top surface of the decoupling capacitor.

The decoupling scheme of the present invention provides many features and advantages relative to prior art decoupling schemes. For example, the very thin dielectric layer (e.g., about 0.001 inch) of the capacitor reduces the inductance of the decoupling capacitor, reduces the inductance of the decoupling loop and enhances the effectiveness of the decoupling capacitor to suppress high frequency noise. Also, the decoupling capacitor may be attached to the IC within the internal cavity of the IC package without interfering with existing highly automated IC assembly processes such as die attachment and wire bonding. Still another important feature of this invention is an improvement in heat transfer from the IC chip out of the IC package.

The above discussed and other features and advantages of the present invention will be appreciated and understood by those of ordinary skill in the art from the following detailed description and drawings.

BRIEF DESCRIPTION OF THE DRAWINGS

Referring now to the drawings wherein like elements are numbered alike in the several Figures:

FIG. 5A is a top plan view of an electrode for use in a decoupling capacitor in accordance with a first embodiment of the present invention;

FIG. 5B is a perspective view similar to FIG. 5A but with the tabs bent upwardly;

FIG. 6 is a top perspective view of a bottom electrode of a decoupling capacitor in accordance with the first embodiment of the present invention;

FIG. 7 is a cross sectional elevation view of a partially completed decoupling capacitor in accordance with the first embodiment of the present invention;

FIG. 8 is a side elevation view of a completed decoupling capacitor in accordance with a first embodiment of the present invention;

FIG. 15 is a top perspective view of a decoupling capacitor in accordance with a third embodiment of the present invention;

FIG. 16 is a cross sectional elevation view along the lines 16—16 of FIG. 15;

FIG. 17 is right side view of the decoupling capacitor of FIG. 15;

DESCRIPTION OF THE PREFERRED EMBODIMENT

Figure 1A:
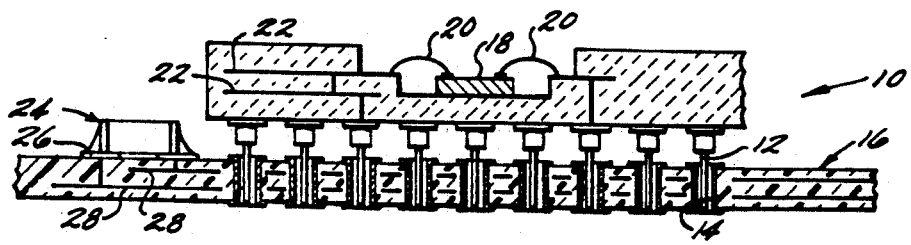
FIG. 1A is a cross sectional elevation view of a decoupling scheme in accordance with the prior art.
Figure 1B:
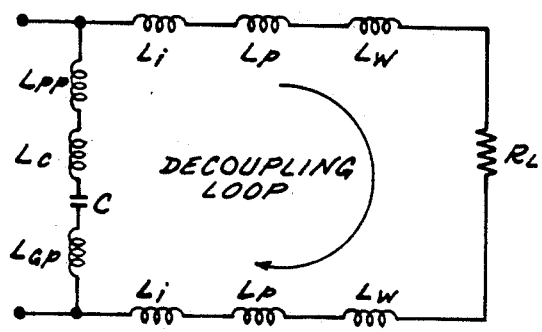
FIG. 1B is a circuit view of the decoupling loop of FIG. 1A.

Referring first to FIGS. 1–3, several decoupling schemes for use in conjunction with integrated circuit packages having internal cavities such as PGA packages are shown. Turning first to FIGS. 1A and 1B, a PGA package 10 is shown electrically interconnected by a plurality of pins 12 to through holes 14 in a multilayer printed wiring board 16. Within PGA package 10 is an integrated circuit chip 18 which is wire bonded at 20 to voltage, ground and signal planes 22 within package 10. Positioned exteriorly on circuit board 16 is a multilayer chip capacitor 24 which is connected at surface mounting pads 26 to voltage and ground planes 28 of multilayer circuit board 16.

Referring to FIG. 1B, the decoupling scheme of FIG. 1A will exhibit a relatively large inductance as shown by the decoupling loop in the schematic of FIG. 1B wherein $L_I$ is equal to the inductance of those printed wiring board internal portions of the voltage plane from the capacitor mounting pads to the PGA voltage pin; $L_P$ is equal to the inductance of the PGA voltage pins plus the interconnecting vias plus that portion of the PGA voltage plane to the point of wire bonding; $L_W$ is equal to the inductance of the bonding wire; $R_L$ is equal to the resistive load representing the power dissipated by the IC die; $L_{PP}$ is equal to the inductance of the interconnecting via from the printed wiring board voltage/ground plane to the multilayer capacitor mounting pad (with the second set of $L_W$, $L_P$ and $L_I$ accounting for the ground side of the circuit); $L_C$ is equal to the inductance of the decoupling capacitor; and C is equal to the capacitance of the decoupling capacitor.

Figure 2A:
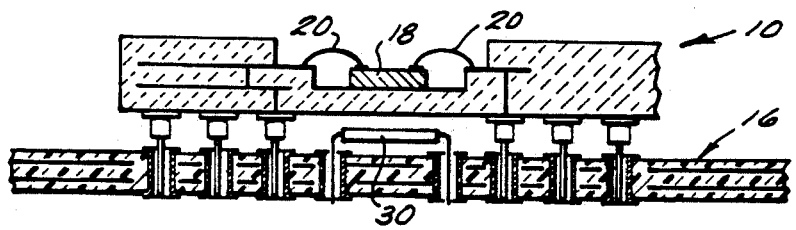
FIG. 2A is a cross sectional view of a decoupling scheme in accordance with the prior art.
Figure 2B:
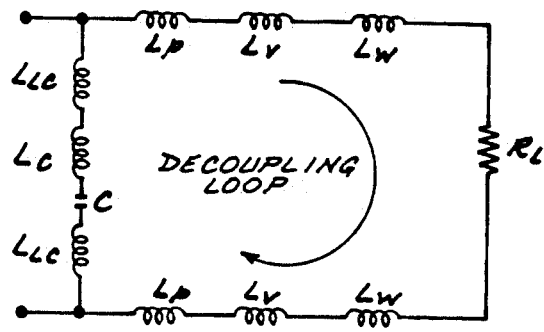
FIG. 2B is a circuit diagram of the decoupling loop of FIG. 2A.

In FIG. 2A, a second prior art decoupling configuration is shown wherein a decoupling capacitor 30 is positioned underneath PGA package 10 in a configuration similar to that depicted in U.S. Pat. No. 4,626,958 which is assigned to the assignee hereof and incorporated herein by reference. As shown in FIG. 2B, the decoupling scheme of FIG. 2A has less inductance than that of FIG. 1A but is nevertheless relatively high. In FIG. 2B, $L_P$ is equal to the inductance of the PGA voltage/ground pins; $L_V$ is equal to the inductance of the internal PGA via interconnections for voltage and ground, plus portions of voltage and ground PGA planes; $L_W$ is equal to the inductance of the bonding wire; $R_L$ is equal to the resistive load representative of the power dissipated by the IC die; $L_{LC}$ is equal to the inductance of the pins of the decoupling capacitor; $L_C$ is equal to the inductance of the body of the decoupling capacitor; and C is equal to the capacitance of the decoupling capacitor.

Figure 3A:
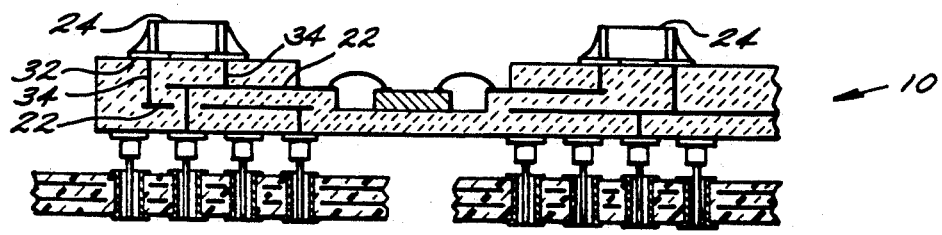
FIG. 3A is a cross sectional elevation view of a decoupling scheme in accordance with the prior art.
Figure 3B:
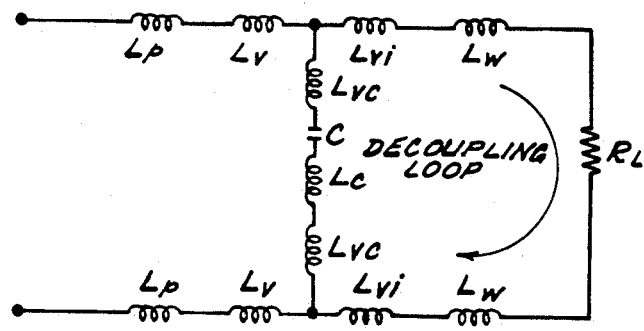
FIG. 3B is a circuit diagram of the decoupling loop of FIG. 3A.

FIG. 3A shows still another prior art decoupling scheme wherein multilayer capacitors 24 are positioned on bonding pads 32 located on the upper surface of PGA package 10. In turn, bonding pads 32 are connected to the PGA voltage and ground planes 22 by interconnecting vias 34. Turning to FIG. 3B, the decoupling scheme of FIG. 3A has even less inductance than that of either FIGS. 1A or 2A. Again, however, the decoupling scheme of FIG. 3A nevertheless provides higher inductance than is desirable with the increasing speed and sophistication of electronic circuitry. In FIG.

3B, $L_P$ is equal to the inductance of the PGA pin length in the voltage plane of the printed wiring board to the PGA package; $L_V$ is equal to the inductance of the via interconnect from the PGA pin to the point of contact of the via that connects the MLC capacitor 24 to the PGA voltage plane, plus the inductance of the portion of the voltage plane between those two vias; $L_{Vi}$ is equal to the inductance of the portion of the PGA voltage plane from the via of the MLC capacitor to the point of wire bonding; $L_W$ is equal to the inductance of the wire bond; $R_L$ is equal to the resistive load representative of the power dissipated by the IC die; $L_{VC}$ is equal to the inductance of the via that connects the capacitor mounting pad to the PGA voltage plane; $L_C$ is equal to the inductance of the MLC capacitor itself; and C is equal to the capacitance of the decoupling capacitor (MLC).

Figure 4A:
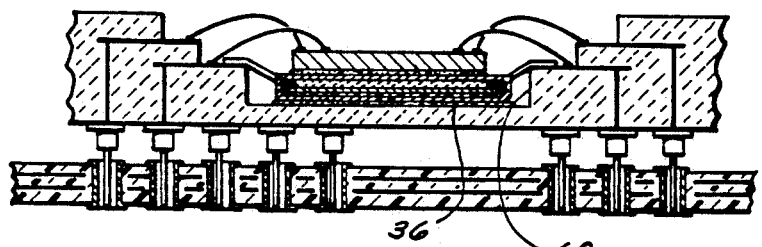
FIG. 4A is a cross sectional elevation view of an internally decoupled PGA package in accordance with the present invention.
Figure 4B:
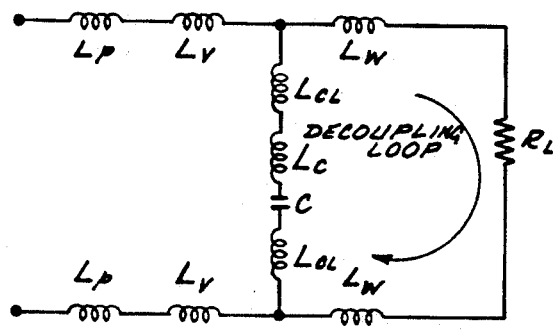
FIG. 4B is a circuit diagram of a decoupling loop for the integrated circuit package of FIG. 4A.

As will be discussed and as is shown in FIGS. 4A and 4B, in accordance with the present invention, a decoupling capacitor 36 is mounted internally within the PGA package 10 for provision of noise suppression at an inductance which is lower than that shown in any one of FIGS. 1A, 2A or 3A. Prior to discussing FIG. 4A in any detail however, a discussion will now be made of the decoupling capacitor 36 and its preferred construction.

Referring to FIGS. 5A, 5B and 6-9, decoupling capacitor 36 comprises a parallel plate type decoupling capacitor having a top conductor 38 shown in FIG. 5A and a bottom conductor 40 shown in FIG. 6. Conductor 38 has a square or rectangular base section 42 and a pair of offset tabs 44 and 46 which extend outwardly from base 42 on opposed sides thereof. Extending from base 42, and adjacent to and parallel to each tab 44 and 46 is a conductive lead 48 and 50, respectively. Each conductive lead 48 and 50 extends in a coplanar fashion with extensions 44 and 46. Bottom electrode 40 has a substantially square or rectangular configuration commensurate in size to base 42 of electrode 38. In addition, electrode 40 includes a pair of leads 52 and 54 which are offset and extend outwardly from opposed sides of electrode 40.

Figure 9:
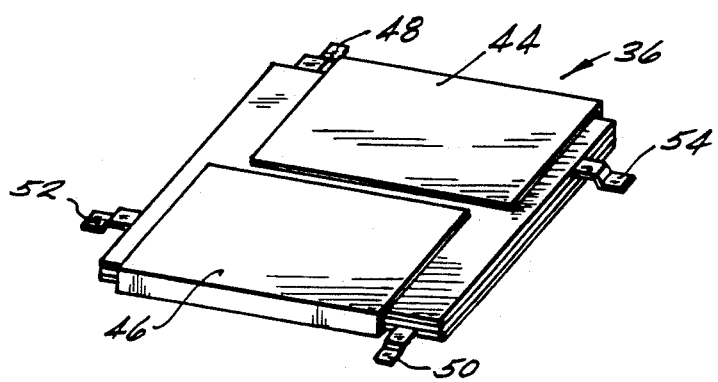
FIG. 9 is a perspective view of the decoupling capacitor of FIG. 8.

During assembly of decoupling capacitor 36, extensions 44 and 46 are initially bent upwardly at right angles to base 42 as shown in FIG. 5B. Next, a single layer of a high dielectric constant material such as barium titanate or a relaxor dielectric such as lead magnesium niobate is attached to base section 42 of conductor 38 by a non-conductive adhesive. An important feature of decoupling capacitor 36 is that the thickness of dielectric layer 56 (see FIG. 7) is very small and preferably between 0.005–0.0002". This small thickness is important to obtain low inductance for decoupling capacitor 36. After dielectric layer 56 is positioned on base 42 of electrode 38, bottom conductor 40 is attached to dielectric layer 56 by means of a non-conductive adhesive, as when attaching top conductor 38. Conductor 40 will be in alignment with portion 42 of conductor 38 so that dielectric layer 56 is sandwiched between electrode 40 and base 42 of electrode 38. Then, an adhesive coated insulating film 58 is attached to bottom electrode 40. Next, each tab 44 and 46 is folded over and bent downwardly so as to rest on a surface of insulating layer 58 which is opposed from bottom electrode 40. It will be appreciated that insulating layer 58 can comprise any suitable nonconducting material such as a polyimide or a glass enamel layer. After assembly of decoupling capacitor 36, conductive leads 48, 50, 52 and 54 are shaped (e.g., bent into a "Z" shape) to correspond with and be attached to the voltage and ground wire bonding fingers of the PGA IC package. The final configuration for the conductive leads is shown in FIGS. 8 and 9.

Figure 10:
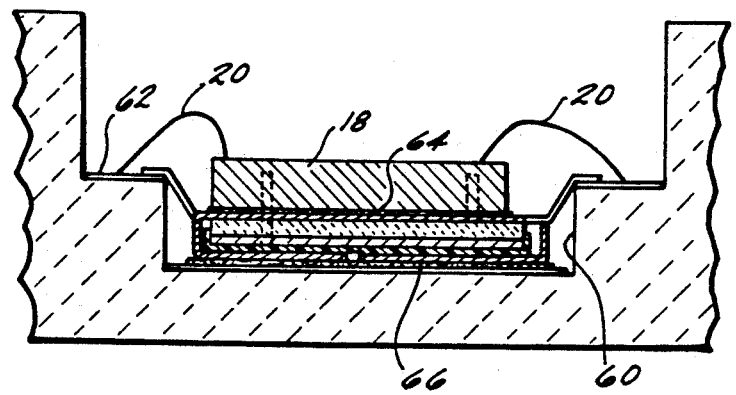
FIG. 10 is an enlarged cross sectional view of a portion of the internally decoupled decoupling capacitor of FIG. 4A.

Referring now to FIGS. 4A and 10, decoupling capacitor 36 is shown positioned within the die cavity 60 of a pin grid array package. Capacitor 36 is oriented such that bent tabs 44 and 46 are facing downwardly and leads 48, 50, 52 and 54 extend at an upward angle so as to mate with the wire bonding sites (hereinafter referred to as the PGA package conductive "fingers", said fingers being shown at 82 in FIG. 14) on the flat shoulder 62 which surrounds cavity 60. In turn, IC chip 18 rests on the top electrode 38 of decoupling capacitor 36 and is bonded thereto by a layer of electrically and thermally conductive adhesive 64. It will be appreciated that a second layer of adhesive 66 bonds decoupling capacitor 36 to the bottom of cavity 60. Leads 48, 50, 52 and 54 of decoupling capacitor 36 will be electrically connected (using solder, welding or other suitable means) to the selected voltage and ground sites of the PGA fingers so as to provide the desired noise suppression.

It will be appreciated that the folded tab decoupling capacitor 36 provides at least two important beneficial effects. First, folded tabs 44 and 46 provide efficient heat transmission from the bottom of IC chip 18 to the PGA IC package 10. Secondly, decoupling capacitor 36 provides relatively low inductance contribution from the tabs per se to the overall inductance of the decoupling capacitor. In addition, when properly dimensioned, capacitor leads 48, 50, 52 and 54 can be made of a minimum length thereby minimizing their contribution to the inductance of capacitor 34.

Figure 11:
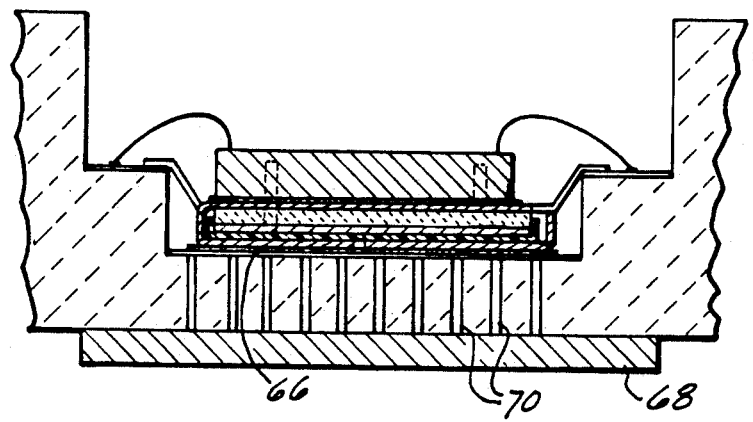
FIG. 11 is a enlarged cross sectional view similar to FIG. 10 showing a preferred heat sink embodiment of the present invention.

Heat transmission in an internal decoupled PGA package or the like in accordance with the present invention is increased further by use of an additional heat sink as shown in FIG. 11. In this embodiment, a heat sink 68 comprises a thermally conductive (e.g., metal) plate and thermally communicates with decoupling capacitor 34 by posts or vias 70 which extend within the body of the PGA package between plate 68 and thermally conductive adhesive layer 66. Post 70 will extract heat away from the IC chip through the folded electrode 38 of decoupling capacitor 36. Electrically and thermally conductive adhesive layers 64 and 66 may comprise any suitable adhesive such as silver filled epoxy or polyimide adhesive.

It will be appreciated that because decoupling capacitor 36 is quite thin overall (0.008"–0.015"), the capacitor 36 becomes nonintrusive with respect to the IC assembly processes including die attachment and wire bonding. The height of the IC chip (once installed on top of the decoupling decapacitor) will not be appreciably different from the height of the IC chip in the absence of the decoupling capacitor. Therefore, no significant changes are required with respect to the physical positionings of the die attachment and die bonding machines nor to the software which controls said machinery when accommodating the additional IC chip height introduced by the decoupling capacitor 34 positioned thereunder.

As shown in FIG. 4B, the decoupling loop provided by the internally positioned decoupling capacitor of the present invention will exhibit an overall lower inductance relative to the decoupling loops of prior art FIGS. 1B, 2B or 3B. Referring to FIG. 4B, $L_P$ is equal to the inductance of the PGA package pin portion from the soldered joint at the printed wiring board to the point of ingress to the PGA package; $L_V$ is equal to the inductance of the internal via interconnection to the point of contact of the bonding wire in the PGA package wire bonding "finger"; $L_W$ is equal to the inductance of the bonding wire; $L_{CL}$ is equal to the inductance of the leads of the decoupling capacitor 34; $L_C$ is equal to the inductance of the decoupling capacitor; $R_L$ is equal to the resistive load representing the resistive power component dissipated by the integrated circuit; and C is equal to the capacitance of the decoupling capacitor. In the circuit of 4B, $L_{CL}$ may be made quite small (by proper dimensioning). $L_W$ is fixed and the main contributor to the inductance of the decoupling loop is the capacitive body itself. By making the dielectric layer very thin, that inductance can also be made extremely small. By comparing the equivalent circuits of FIG. 4B with that of FIGS. 1B, 2B and 3B, it is clear that the FIG. 4B circuit is essentially much less inductive than the prior art circuits. As a result, the IC circuit package of FIG. 4A may be operated at higher clock rates with tolerable noise levels relative to prior art integrated circuit packages.

Figure 13:
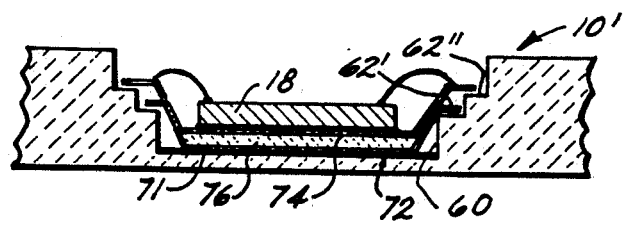
FIG. 13 is a cross sectional elevation view depicting the decoupling capacitor of FIG. 12 mounted in a PGA package.
Figure 14:
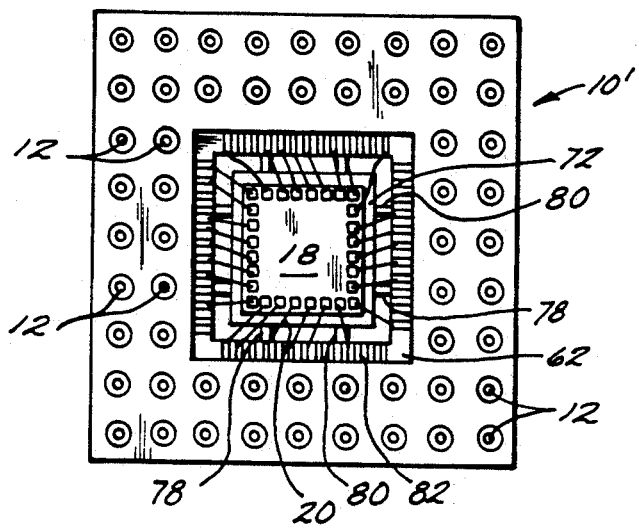
FIG. 14 is a bottom view of the internally decoupled PGA package of FIG. 13.
Figure 12:
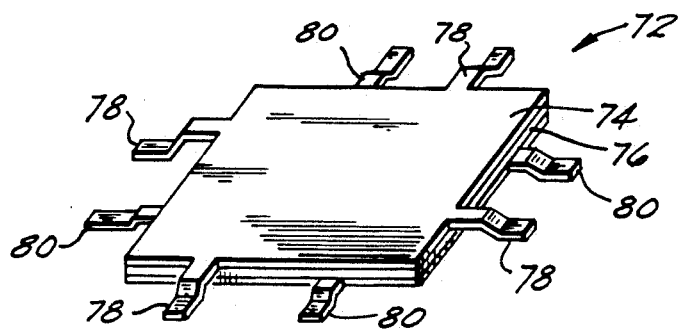
FIG. 12 is a top perspective view of a second embodiment of a decoupling capacitor in accordance with the present invention.

Another embodiment of an internally decoupled PGA package in accordance with the present invention is shown in FIGS. 12-14. In the second embodiment, a decoupling capacitor having a more simplified construction relative to decoupling capacitor 36 is used. This simplified decoupling capacitor is shown at 72 in FIGS. 12-13 and comprises a pair of opposed conductors 74 and 76 which sandwich therebetween a thin layer of dielectric (preferably ceramic) having a high dielectric constant such as those dielectrics discussed above. The thickness of the dielectric layer 76, and the size and configuration of leads 78 and 80 are all similar to that associated with decoupling capacitor 36. The primary difference between decoupling capacitor 72 and 36 is the lack of the bendable tabs 44 and 46 in the simplified version 72. As a result, decoupling capacitor 72 will have less heat transfer capabilities than associated with the decoupling capacitor 36. FIGS. 13 and 14 depict decoupling capacitor 72 adhesively bonded between cavity 60 and IC chip 18. In the particular PGA package shown in FIGS. 13 and 14, the signal, ground and voltage plane bonding sites of package 10' are exposed at two shoulders 62' and 62" of various heights. As a result, leads 78 and 80 include different heights commensurate with the different heights of shoulders 62' and 62". FIG. 14 is a bottom view depicting bonding sites of IC chip 18 with selected voltage and ground "fingers" 82 of PGA package 10' being connected by wire bonding to IC 18 and by respective leads 78, 80 to decoupling capacitor 72.

Turning now to FIGS. 15-19, still another embodiment of a decoupling capacitor suitable for positioning internally in an IC package having an internal cavity is shown. Turning first to FIGS. 15-17, the decoupling capacitor is depicted at 90 and comprises a relatively high capacitance layer (which has been made by known thick or thin film methods) sandwiched between a pair of thin electrodes; with this resultant capacitive element being deposited onto a ceramic or other suitable substrate. Capacitor 90 includes a relatively thick base or substrate 92 (e.g., 0.008-0.010" thick) which is preferably made of a ceramic material and includes a first (inner) electrode 94 printed thereon. Next, a thin layer of dielectric material 96 having a high dielectric constant is provided onto electrode 94. A second (upper) electrode 98 is then printed or otherwise deposited onto the upper surface of dielectric layer 96. Upper or outer electrode 98 wraps completely around dielectric layer 96 and the ceramic substrate 92 as shown in FIG. 16. This wrap around feature of electrode 98 enables capacitor 90 to perform the function of extracting heat from the integrated circuit die to the PGA IC package in a manner similar to the bent tab configuration of decoupling capacitor 36.

The ceramic substrate 92 can be made of alumina (96%), aluminum nitride, zirconia, beryllia or other suitable material. Among the above mentioned, aluminum nitride and beryllia have the advantage of higher thermal conductivity than alumina (a high thermal conductivity is important for enhanced heat removal from the IC package).

In general, the capacitive element (made up of electrodes 94, 98 and dielectric layer 96) may be built up on ceramic substrate 92 using either thick film or thin film techniques. The thick film technique may utilize processes already well known in the art including screening, drying, firing and bore coating of castellations. The thin film technology may employ any one of several different methods for coating of the dielectric and electrode layers. Among these techniques may be Chemical Vapor Deposition (CVD), Low Temperature Arc Vapor Deposition (LTAVD), Spin-Coating by a Sol or Sol-gel Technology, Sputtering or Ion-Plating. Some of those techniques may only be compatible for depositing either the dielectric or the electrode, while some may be utilized to produce both the dielectric and the electrode. A discussion will now be made in more detail of the preferred thick and thin film techniques employed for forming the capacitive element.

The electrode layers 94, 98 may be either screen printed, vapor deposited or sputtered and can be made of silver palladium, gold, tungsten, molybdenum or other suitable base metal that will not oxidize at the sintering temperatures of the ceramic dielectric layer 96. The electrodes are preferably silver/palladium thick film conductor compositions or other conductive metallizations made in the form of thick film inks; or any conductor deposited by a vacuum technology.

The dielectric layer 96 preferably comprises a printed layer of a glass ceramic high dielectric paste (having a DK of approximately 1750-3000), with a fixed thickness in the vicinity of 0.001"-0.0001". Examples of such pastes include barium titanate, lead magnesium niobate with or without glass additions or strontium titanate. Alternatively, dielectric layer 96 can be fabricated by a dielectric sol-gel, spin deposited on the electrode layer 94 and sintered at relatively low temperature (600°-800° C.). The dielectric sol-gel is preferably based on a barium titanate which is properly doped to achieve the desired temperature stability characteristic. One of the advantages of the latter sol-gel embodiment is that very thin dielectric films can be obtained (approximately 1 micron), so that a very high capacitance volumetric efficiency can be realized. Also, with a very thin dielectric layer, the inductance of the capacitor body itself is greatly reduced, thereby reducing the inductance of the decoupling loop and enhancing the effectiveness of the decoupling capacitor 70 to suppress high frequency noise.

If a sol-gel method is used to fabricate the dielectric layer 96, the surface of the first electrode layer should be polished to achieve a finish with features of less than 0.1 micron in size, to minimize the possibility of puncturing the dielectric layer.

Figure 18:
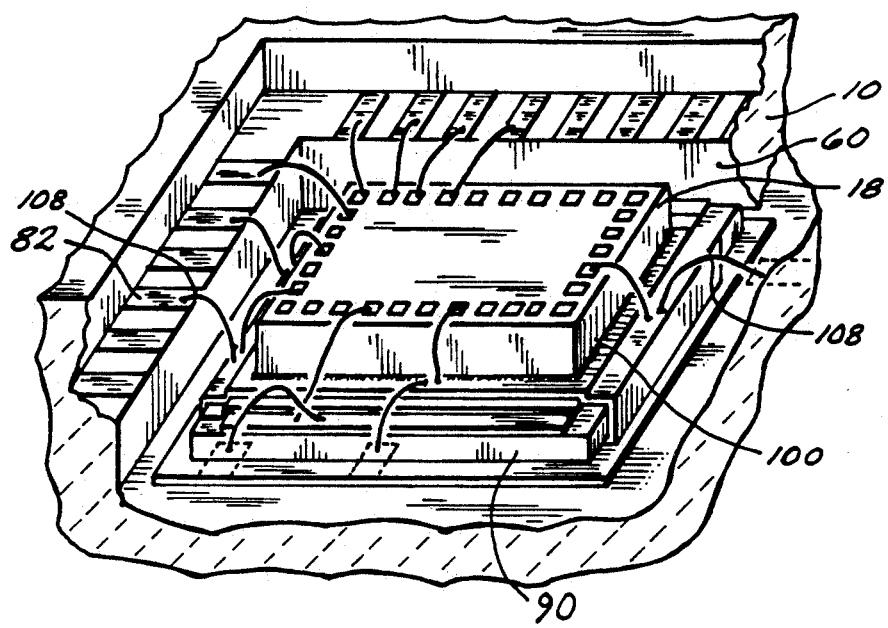
FIG. 18 is a perspective view with portions cut away of the decoupling capacitor of FIG. 15 disposed within a PGA package.

FIG. 18 depicts decoupling capacitor 90 positioned within the cavity 60 of a PGA package 10 with an IC chip 18 having been electrically and thermally bonded via a suitable adhesive layer 100 to upper electrode 98. Die wire bonding may be accomplished by wire bonding exposed ends 102 and 104 of bottom electrode 94; and wire bonding ends 106 and 108 of outer electrode 98 to wire bonding "fingers" 82 of PGA package 10. These wire bonding filaments are identified at 108 in FIG. 18. In addition, wire bonding takes place directly between IC die 18 and fingers 82 of PGA package 10.

Figure 19:
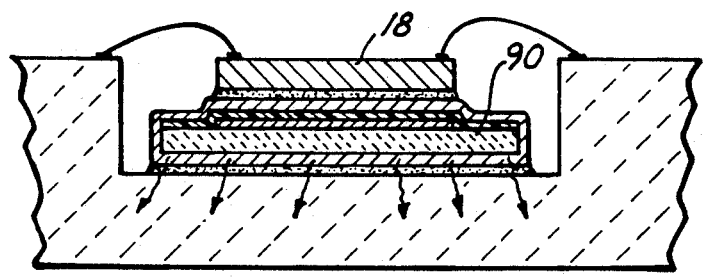
FIG. 19 is a cross sectional elevation view of the assembled decoupling capacitor of FIG. 15 in PGA package of FIG. 18.

Referring to FIG. 19 and as mentioned hereinabove, in addition to providing decoupling (noise suppression), capacitor 90 also provides heat extraction and transmission from IC die 18 down to the PGA IC package as indicated by the arrows in FIG. 19. This is an important feature of the present invention as improved heat flow from the IC die out of the PGA package 10 overcomes deficiencies related to heat build up and failure of the IC die 18 to function properly. This thermal conduction is appreciably improved if the ceramic substrate 92 is made from aluminum nitride or beryllia which inherently have high thermal conductivity.

Figure 20:
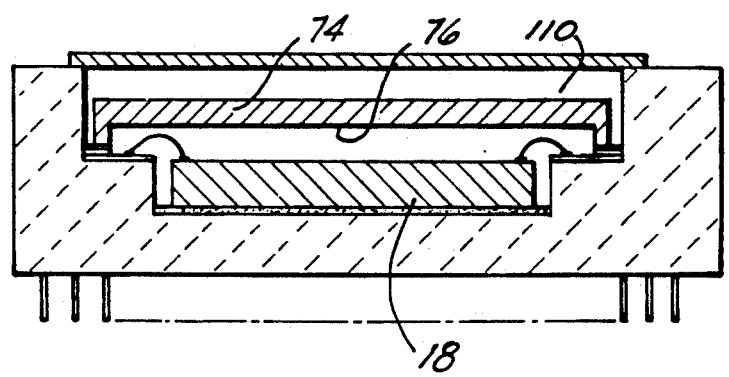
FIG. 20 is a cross sectional elevation view through a fourth embodiment of an internally decoupled PGA package in accordance with the present invention.

While the foregoing embodiments of the present invention have utilized decoupling capacitors for mounting between the die cavity and integrated circuit chip, an alternative embodiment of a decoupling capacitor is shown in FIG. 20 wherein the capacitor 110 is positioned above both the die cavity 60 and the integrated circuit chip 18. In this alternative embodiment, decoupling capacitor 110 has a configuration similar to decoupling capacitor 72 of FIG. 12 with the primary difference residing in the configuration of leads 112. Leads 112 of decoupling capacitor 110 terminate on flattened feet 114 which are received on the wire bonding "fingers" of PGA package 10. Decoupling capacitor 110 is advantageous in that it does not require a special procedure for disposing the decoupling capacitor between the IC chip and the cavity as in the previously discussed embodiments. Thus, there is no potential problem that the thickness of the decoupling capacitor will change the level of the IC chip 18 in any substantial respect.

Figure 21:
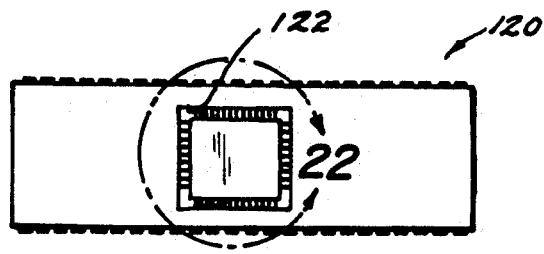
FIG. 21 is a top plan view of a decoupled ceramic dual-in-line IC package.
Figure 22:
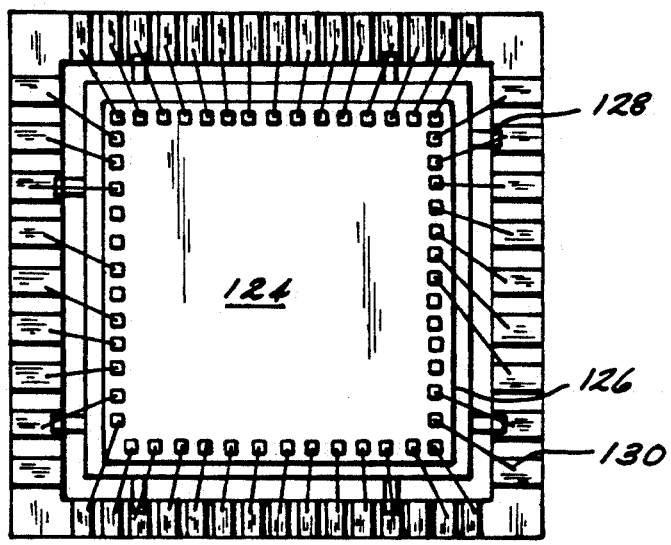
FIG. 22 is an enlarged top plan view of a portion of the package of FIG. 21.

The present invention provides internal decoupling for any integrated circuit package which has an internal die cavity. All of the foregoing embodiments have been described with respect to a PGA IC package. However, it will be appreciated that the present invention is equally applicable to any other package having internal die cavities such as ceramic dual-in-line packages, ceramic flat quad packs and ceramic leadless chip carriers. For example, FIGS. 21 and 22 depict a forty eight pin ceramic dual-in-line integrated circuit package at 120 having an internal cavity 122 which receives an IC die 124. A decoupling capacitor 126 made in conjuction with any of the previously discussed embodiments includes a plurality of leads 128 which are attached to appropriate wire bonding "fingers" 130 in die attached cavity 122.

While preferred embodiments have been shown and described, various modifications and substitutions may be made thereto without departing from the spirit and scope of the invention. Accordingly, it is to be understood that the present invention has been described by way of illustrations and not limitation.

What is claimed is:

1. An integrated circuit (IC) package comprising:
   a housing, said housing including an internal cavity for receiving and housing an integrated circuit chip, said housing also including conductive means terminating at said internal cavity at a plurality of terminal fingers, and conductive lead means on said housing exterior, said lead means electrically connected with said conductive means whereby said lead means electrically communicate with said terminal fingers;
   an integrated circuit chip in said internal cavity of said housing, said circuit chip being electrically connected to selected ones of said terminal fingers; and
   a capacitor in said internal cavity, said capacitor being electrically connected to selected ones of said terminal fingers.

2. The IC package of claim 1 wherein said cavity has a base and wherein:
   said capacitor is positioned between said base of said cavity and said circuit chip.

3. The IC package of claim 2 including:
   a first adhesive layer bonding said capacitor to said base of said cavity; and
   a second adhesive layer bonding said capacitor to said circuit chip.

4. The IC package of claim 2 including:
   a heat sink in said housing, said heat sink extending between said internal cavity and said housing exterior, said heat sink thermally communicating with said capacitor to extract heat from said circuit chip.

5. The IC package of claim 4 wherein said heat sink comprises:
   a plate on said package exterior; and
   thermally conductive vias extending between said plate and said capacitor.

6. The IC package of claim 1 wherein said cavity has a base and wherein:
   said circuit chip is positioned between said base of said cavity and said capacitor.

7. The IC package of claim 1 wherein said capacitor comprises:
   a first electrode having a plurality of leads extending therefrom;
   a second electrode having a plurality of leads extending therefrom; and
   a layer of dielectric material between said first and second electrodes.

8. The IC package of claim 7 wherein said first electrode has a pair of opposed first and second surfaces with said layer of dielectric material being disposed on said first surface and including:
   an insulating layer on said second surface of said first electrode;
   a pair of tabs extending outwardly from opposite sides of said second electrode, said tabs being bent onto said insulating layer, said bent tabs being substantially coplanar with said first and second electrodes.

9. The IC package of claim 8 wherein:
   said tabs are offset from each other.

10. The IC package of claim 7 wherein said layer of dielectric has a thickness of less than 0.005 inch.

11. The IC package of claim 7 including:
    a ceramic substrate, said first electrode of said capacitor being attached to said ceramic substrate, said layer of dielectric comprising at least one thin film of deposited dielectric and said first and second electrodes comprising a pair of thin films of deposited electrodes.

12. The IC package of claim 11 wherein:
said electrodes are screen printed, vapor deposited or sputtered.

13. The IC package of claim 11 wherein:
said dielectric layer comprises a ceramic paste or dielectric sol-gel.

14. The IC package of claim 11 wherein:
said dielectric layer has a dielectric constant of between about 1750-2000.

15. The IC package of claim 11 wherein:
said dielectric layer has a thickness of less than or equal to 0.0010 inch.

16. The IC package of claim 11 wherein:
said ceramic substrate has a thickness of less than or equal to 0.010 inch.

17. The IC package of claim 11 wherein said ceramic substrate includes side surfaces and a bottom surface and said second electrode extends along each side surface and said bottom surface.

18. The IC package of claim 1 wherein said capacitor has a thickness of less than 0.015 inch.

19. A decoupling capacitor comprising:
a first electrode having a plurality of leads extending therefrom, said first electrode having a pair of opposed first and second surfaces;
a second electrode having a plurality of leads extending therefrom; and
a layer of dielectric material between said first and second electrodes, said dielectric layer being disposed on said first surface of said first electrode;
an insulating layer on said second surface of said first electrode;
a pair of tabs extending outwardly from opposite sides of said second electrode, said tabs being bent onto said insulating layer, said bent tabs being substantially coplanar with said first and second electrodes.

20. The capacitor of claim 19 wherein:
said tabs are offset from each other.

21. A decoupling capacitor comprising:
a capacitive element formed on a ceramic support substrate, said ceramic substrate including opposed side surfaces, a top surface and a bottom surface, the top and bottom surfaces being larger than said opposed side surfaces, said capacitive element being disposed substantially on said top surface and comprising at least one thin layer of deposited dielectric sandwiched between at least a pair of thin layers of deposited electrodes defining a first inner electrode and a second outer electrode, wherein said second outer electrode extends from said top surface along both of said opposed side surfaces and said bottom surface and wherein said bottom surface is free of said first inner electrode.

* * * * *